US012696735B2

(12) United States Patent
Mizumoto

(10) Patent No.: US 12,696,735 B2
(45) Date of Patent: Jul. 28, 2026

(54) INSPECTING APPARATUS, PEELING APPARATUS, AND LEARNED MODEL GENERATING METHOD

(71) Applicant: DISCO CORPORATION, Tokyo (JP)

(72) Inventor: Yuta Mizumoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 592 days.

(21) Appl. No.: 17/821,340

(22) Filed: Aug. 22, 2022

(65) Prior Publication Data

US 2023/0075359 A1 Mar. 9, 2023

(30) Foreign Application Priority Data

Sep. 7, 2021 (JP) ................................. 2021-145807

(51) Int. Cl.
H10P 90/00 (2026.01)
G06T 7/00 (2017.01)
(52) U.S. Cl.
CPC ............ H10P 90/129 (2026.01); G06T 7/001 (2013.01); G06T 2207/30148 (2013.01)
(58) Field of Classification Search
CPC . H01L 21/02024; G06T 7/001; G06T 7/0004; G06T 2207/30148; G06T 2207/20081; G06T 2207/0084; G06T 5/50; G06T 11/60; G06T 2207/20084; G01N 2291/044; G01N 21/9501; G01N 2071/8887; G01N 2223/6116
USPC ............................................ 356/237.1–237.5
See application file for complete search history.

(56) References Cited

U.S. PATENT DOCUMENTS

| | | | |
|---|---|---|---|
| 2007/0237385 A1 | 10/2007 | Kato | |
| 2018/0154543 A1 | 6/2018 | Hirata | |
| 2019/0220972 A1 | 7/2019 | Iwanaga | |
| 2020/0141879 A1 | 5/2020 | Regensburger et al. | |
| 2021/0334946 A1* | 10/2021 | Buzaglo | ............... G01N 21/956 |

(Continued)

FOREIGN PATENT DOCUMENTS

| | | | |
|---|---|---|---|
| JP | 2007278928 A | | 10/2007 |
| JP | 2011221750 A | * | 11/2011 |
| JP | 20133331 A | * | 2/2013 |

(Continued)

OTHER PUBLICATIONS

Office Action issued in counterpart Japanese patent application No. 2021-145807, dated Apr. 22, 2025.

(Continued)

*Primary Examiner* — Michael A Lyons
(74) *Attorney, Agent, or Firm* — Greer Burns & Crain Ltd.

(57) ABSTRACT

An inspecting apparatus for inspecting an ingot having a polished surface includes a holding table configured to hold the ingot with the polished surface of the ingot exposed, a light source configured to irradiate the polished surface of the ingot held by the holding table with light at a predetermined incidence angle, an imaging unit configured to condense and photograph reflected light reflected by the polished surface of the ingot, and form a photographed image emphasizing unevenness produced on the polished surface by a crack extending in the ingot, and a control unit including a determining section configured to determine the state of the ingot by comparing the formed photographed image with a preset condition.

8 Claims, 16 Drawing Sheets

(56)        References Cited

U.S. PATENT DOCUMENTS

2021/0364450 A1 * 11/2021 Lauber ...................... G06T 5/60

FOREIGN PATENT DOCUMENTS

| JP | 2018067647 | A | * | 4/2018 |
|----|------------|-----|---|---------|
| JP | 2019124591 | A | | 7/2019 |
| JP | 2020188117 | A | * | 11/2020 |
| KR | 102298614 | B1 | * | 9/2021 |
| TW | 201825222 | A | | 7/2018 |
| TW | 201908716 | A | | 3/2019 |

OTHER PUBLICATIONS

Office Action issued in counterpart Taiwanese patent application No. 111133158, dated Oct. 21, 2025.

* cited by examiner

INSPECTING APPARATUS, PEELING APPARATUS, AND LEARNED MODEL GENERATING METHOD

BACKGROUND OF THE INVENTION

Field of the Invention

The present invention relates to an inspecting apparatus that inspects whether a crack is produced in an ingot, by using a learned model that generates, from an image obtained from reflected light, the crack formed in the ingot.

Description of the Related Art

Semiconductor devices are manufactured by forming a plurality of devices on a wafer manufactured from a semiconductor ingot and dividing the wafer into individual device chips. For example, devices on a wafer formed of silicon are formed after the wafer is cut out from a silicon ingot by a wire saw or the like and is polished. However, a wafer formed of silicon carbide (SiC) is a very hard material, and therefore, it takes a considerable processing time to cut out the wafer from the ingot by the wire saw as compared with silicon.

Accordingly, what is generally called KABRA (registered trademark) processing which forms a peel-off layer by a modified layer and cracks extending from the modified layer in a SiC ingot by irradiating the SiC ingot with a laser beam and peels off a wafer from the peel-off layer has been devised (see Japanese Patent Laid-Open No. 2020-188117, for example). The modified layer remaining after the peeling on the top surface of the ingot, from which the wafer has been peeled off by the KABRA processing, is ground and polished, a peel-off layer is formed in the ingot again by irradiating the top surface with the laser beam, and a next wafer is peeled off. Such a processing method can cut out the wafers from the SiC ingot in a short time.

SUMMARY OF THE INVENTION

However, in rare cases, a crack occurs in the semiconductor ingot after the peeling and the peeled wafers, and may be a cause of the occurrence of a defective wafer unsuitable for forming devices. Therefore, an operator visually checks, one by one, the semiconductor ingot that has not yet been irradiated with the laser beam and the wafers that have not yet been peeled off. However, this takes labor and cost.

Detection of cracks from images obtained by photographing the semiconductor ingot and the wafers has been considered. However, a special camera is necessary to photograph an internal crack not appearing on the top surface of a wafer. In addition, it is difficult to distinguish the produced defect crack from the modified layer remaining in the wafer. In particular, the shape of the crack lacks in regularity, so that it is difficult to determine the crack by a method of providing a threshold value for a numerical value calculated from an image and making the determination.

It is accordingly an object of the present invention to provide an inspecting apparatus, a peeling apparatus, and a learned model generating method that can detect a crack that occurs in a semiconductor ingot.

In accordance with an aspect of the present invention, there is provided an inspecting apparatus for inspecting a semiconductor ingot having one surface and another surface, the one surface being a polished surface resulting from polishing. The inspecting apparatus includes a holding table configured to hold the semiconductor ingot with the polished surface of the semiconductor ingot exposed, a light source configured to irradiate the polished surface of the semiconductor ingot held by the holding table with light at a predetermined incidence angle, an imaging unit configured to condense and photograph reflected light reflected by the polished surface of the semiconductor ingot, and form a photographed image emphasizing unevenness produced on the polished surface by a crack extending in the semiconductor ingot, and a determining section configured to determine a state of the semiconductor ingot by comparing the formed photographed image with a preset condition. The determining section includes a processor and a memory, and includes a learned model configured by machine learning to output, when the photographed image obtained by the imaging unit is input, a determination result indicating whether or not the crack is formed in the semiconductor ingot.

Preferably, the learned model uses a cascade classifier made to learn an image of the crack on the basis of sample images including a photographed image including the crack and a photographed image without the crack.

Preferably, the learned model is a neural network including an input layer to which the photographed image is input and an output layer that outputs the determination result.

In accordance with another aspect of the present invention, there is provided a peeling apparatus for manufacturing, with a peel-off layer as a starting point, a wafer from a semiconductor ingot in which the peel-off layer including a modified layer and a crack extending from the modified layer along a c-plane is formed by irradiating an exposed polished surface of the semiconductor ingot with a laser beam. The peeling apparatus includes a holding table configured to hold the semiconductor ingot, a peeling unit configured to peel off the wafer from the semiconductor ingot held on the holding table, a temporary placement table on which the wafer peeled off by the peeling unit is temporarily placed, and an inspecting unit configured to inspect the wafer held on the temporary placement table. The inspecting unit includes a light source configured to irradiate the polished surface of the semiconductor ingot held by the holding table with light at a predetermined incidence angle, an imaging unit configured to condense and photograph reflected light reflected by the polished surface of the semiconductor ingot, and form a photographed image emphasizing unevenness produced on the polished surface by a crack extending in the semiconductor ingot, and a determining section configured to determine a state of the semiconductor ingot by comparing the formed photographed image with a preset condition. The determining section includes a processor and a memory, and includes a learned model configured by machine learning to output, when the photographed image obtained by the imaging unit is input, a determination result indicating whether or not the crack is formed in the semiconductor ingot.

In accordance with a further aspect of the present invention, there is provided a learned model generating method for generating a learned model configured to determine a state of a semiconductor ingot having one surface and another surface, the one surface being a polished surface resulting from polishing. The learned model generating method includes an image obtaining step of obtaining a plurality of first learning images corresponding to an image of a sample including a crack and a plurality of second learning images corresponding to an image of the sample including no crack, by photographing the semiconductor ingot as the sample by irradiating the polished surface with light from a light source at a predetermined incidence angle and condensing and photographing the light reflected by the polished surface, and a learning step of generating, by machine learning using the first learning images and the second learning images, the learned model configured to output, when an image of the semiconductor ingot is input, a determination result indicating whether or not the crack is formed in the semiconductor ingot.

Preferably, the learned model uses a cascade classifier made to learn an image of the crack on the basis of the first learning images and the second learning images.

Preferably, the learned model is a neural network including an input layer to which the first learning images and the second learning images are input and an output layer that outputs the determination result.

The present invention produces an effect of being able to detect a crack that occurs in an ingot or a wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described in detail with reference to the drawings. The present invention is not limited by contents described in the following embodiments. In addition, constituent elements described in the following include constituent elements readily conceivable by those skilled in the art and essentially identical constituent elements. Further, configurations described in the following can be combined with each other as appropriate. Moreover, various omissions, replacements, or modifications of configurations can be performed without departing from the spirit of the present invention.

First Embodiment

Figure 1:
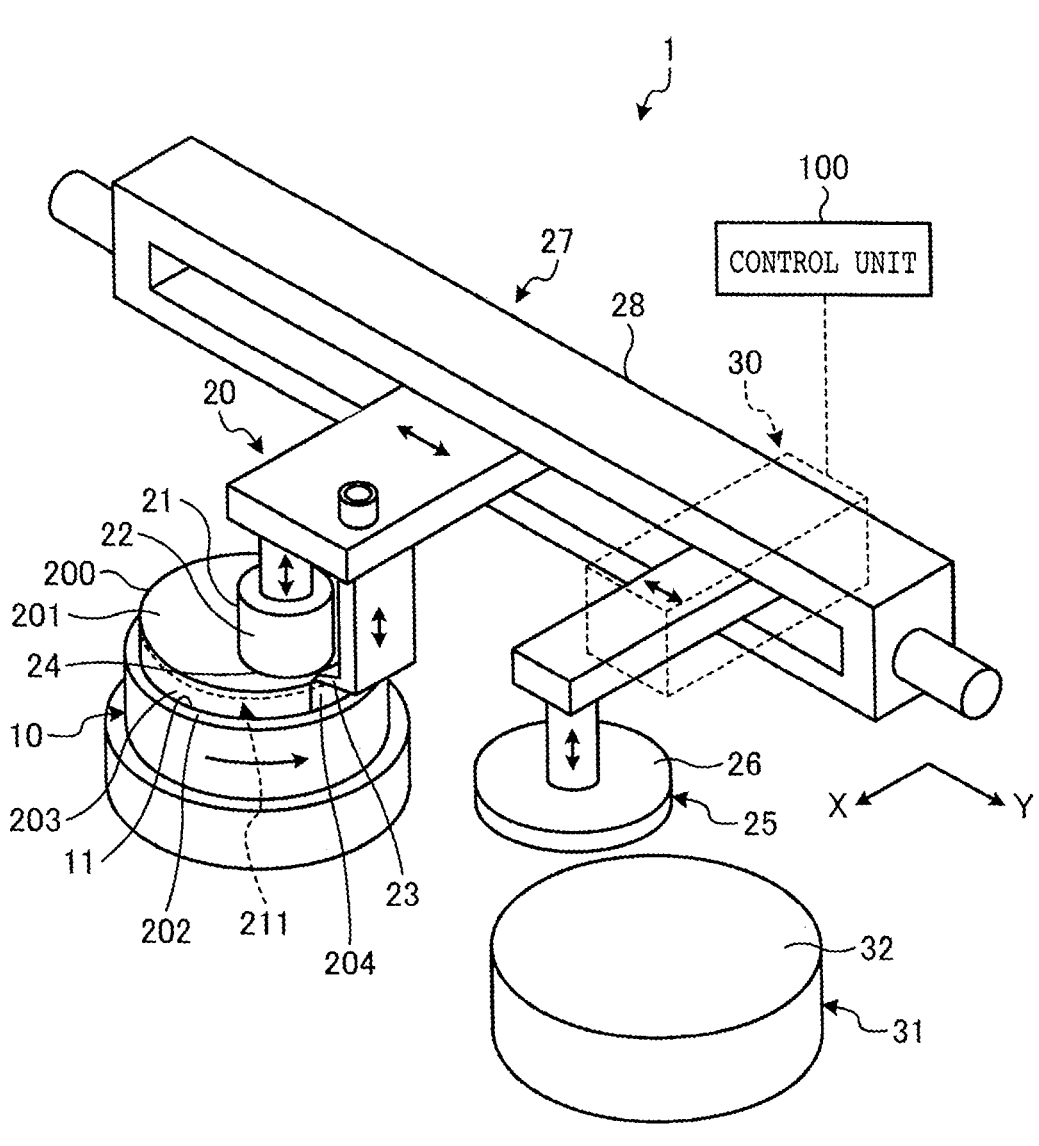
FIG. 1 is a perspective view illustrating an example of a configuration of a peeling apparatus according to a first embodiment.
Figure 2:
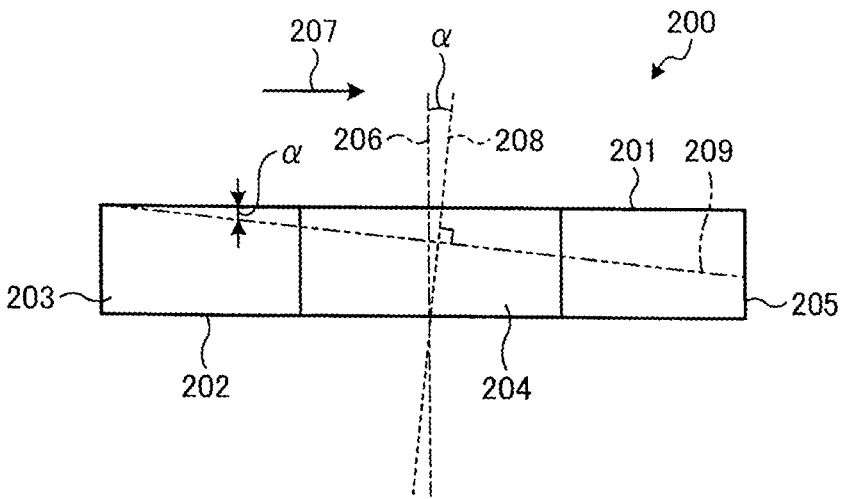
FIG. 2 is a side view of an ingot to be processed by the peeling apparatus illustrated in FIG. 1.
Figure 3:
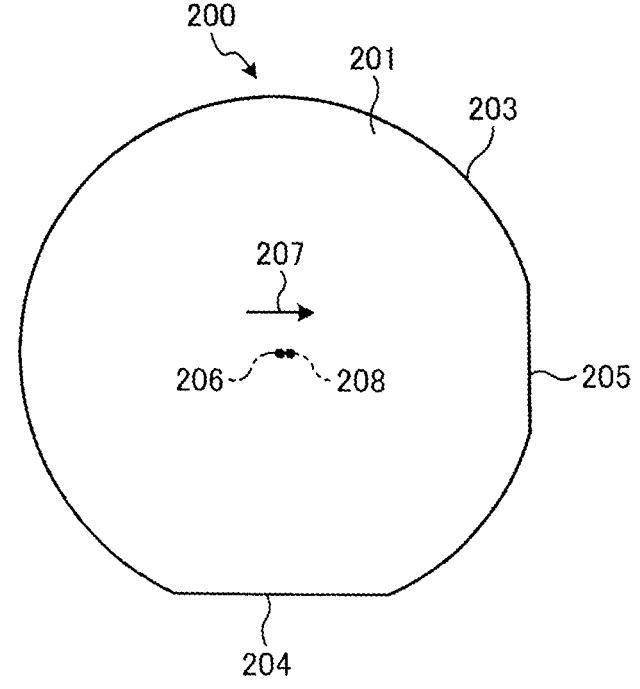
FIG. 3 is a plan view of the ingot illustrated in FIG. 2.
Figure 4:
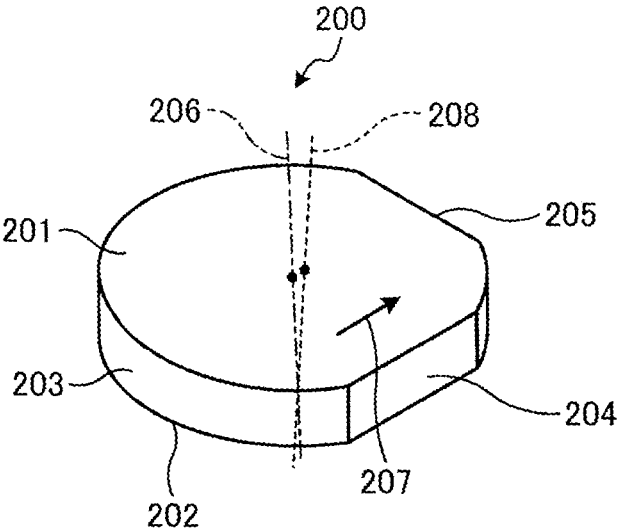
FIG. 4 is a perspective view of the ingot illustrated in FIG. 2.
Figure 5:
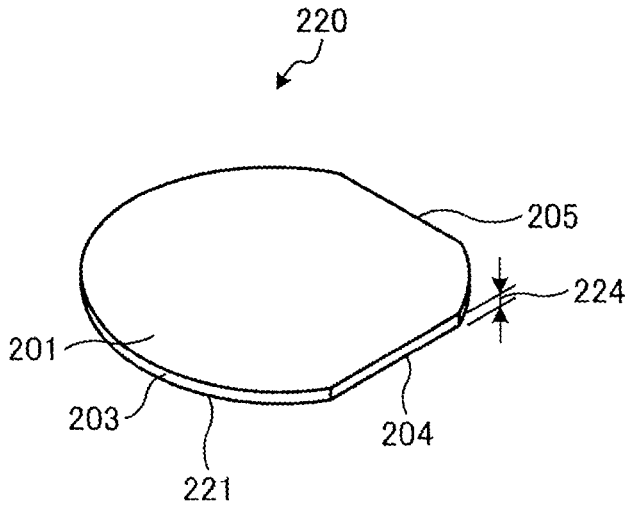
FIG. 5 is a perspective view of a wafer manufactured from the ingot illustrated in FIG. 2.
Figure 6:
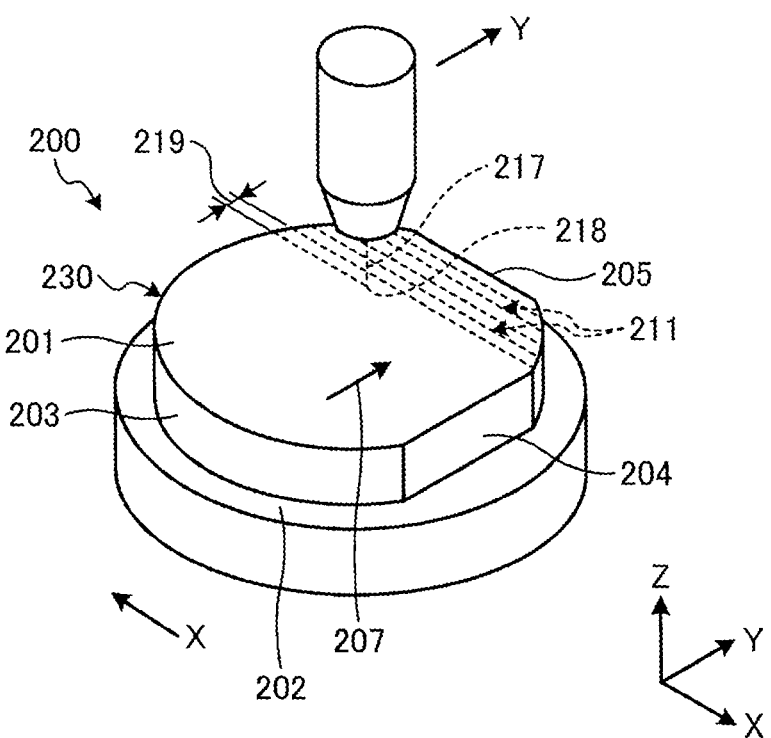
FIG. 6 is a perspective view schematically illustrating a state in which a peel-off layer is being formed in the ingot illustrated in FIG. 2.
Figure 7:
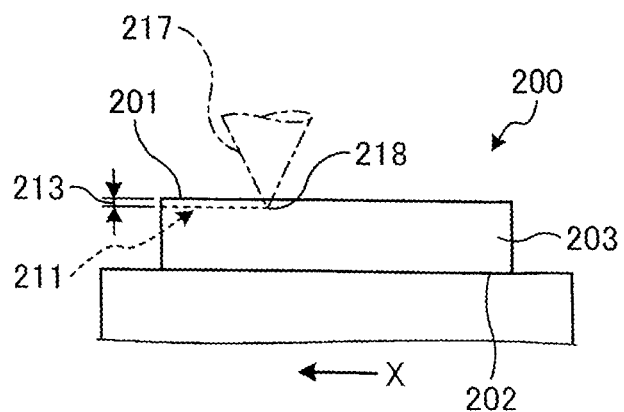
FIG. 7 is a side view schematically illustrating the state in which the peel-off layer is being formed in the ingot illustrated in FIG. 2.
Figure 8:
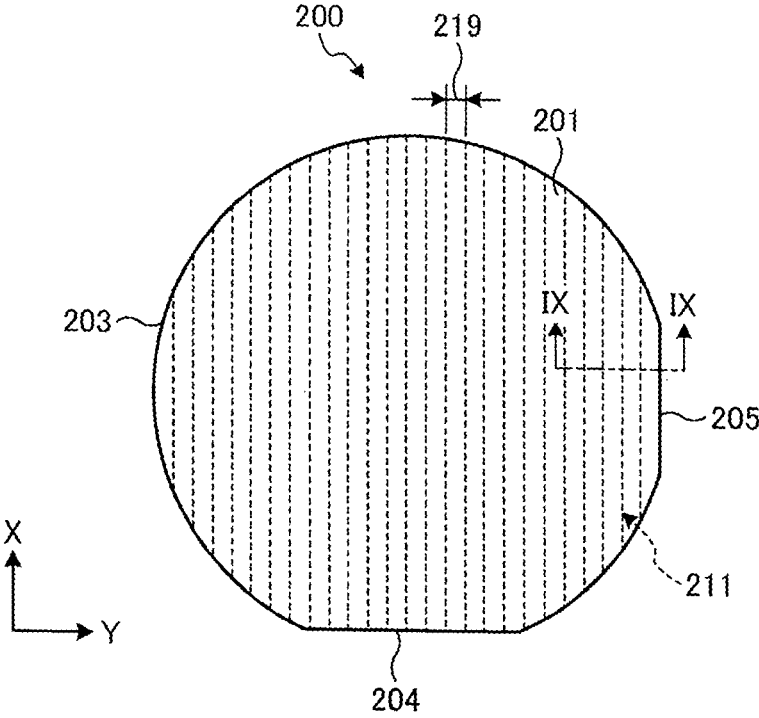
FIG. 8 is a plan view of the ingot in which the peel-off layer is formed.
Figure 9:
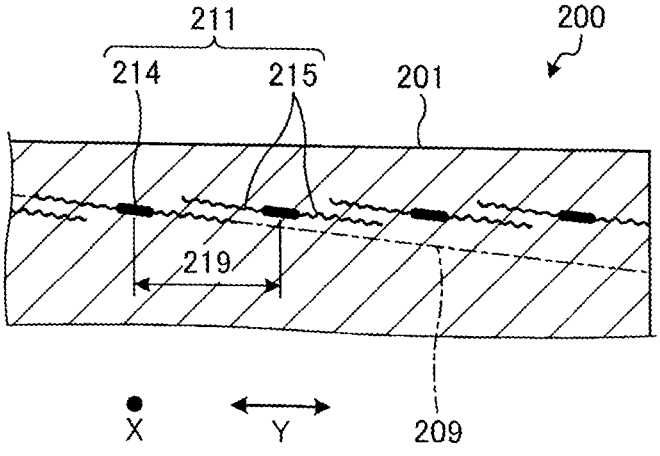
FIG. 9 is a sectional view taken along a line IX-IX in FIG. 8.
Figure 10:
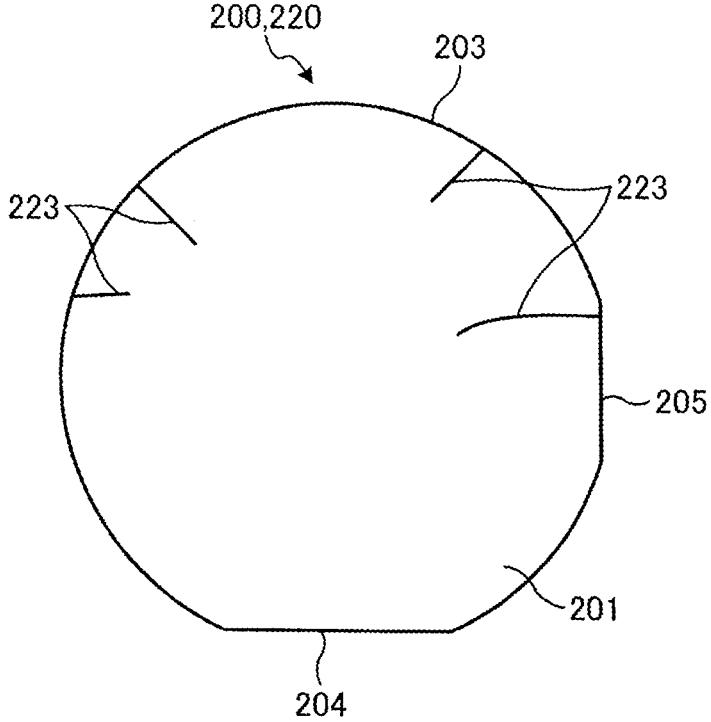
FIG. 10 is a plan view schematically illustrating the ingot and the wafer in which cracks are formed.

An inspecting apparatus and a peeling apparatus according to a first embodiment of the present invention will be described with reference to the drawings. FIG. 1 is a perspective view illustrating an example of a configuration of the peeling apparatus according to the first embodiment. FIG. 2 is a side view of an ingot to be processed by the peeling apparatus illustrated in FIG. 1. FIG. 3 is a plan view of the ingot illustrated in FIG. 2. FIG. 4 is a perspective view of the ingot illustrated in FIG. 2. FIG. 5 is a perspective view of a wafer manufactured from the ingot illustrated in FIG. 2. FIG. 6 is a perspective view schematically illustrating a state in which a peel-off layer is being formed in the ingot illustrated in FIG. 2. FIG. 7 is a side view schematically illustrating the state in which the peel-off layer is being formed in the ingot illustrated in FIG. 2. FIG. 8 is a plan view of the ingot in which the peel-off layer is formed. FIG. 9 is a sectional view taken along a line IX-IX in FIG. 8. FIG. 10 is a plan view schematically illustrating the ingot and the wafer in which cracks are formed.

(Ingot and Wafer)

A peeling apparatus 1 illustrated in FIG. 1 according to the first embodiment is an apparatus that manufactures a wafer 220 (referred to also as a peeled wafer) illustrated in FIG. 5 from a semiconductor ingot 200 (hereinafter abbreviated simply as an ingot) illustrated in FIG. 2, FIG. 3, and FIG. 4. In the first embodiment, the ingot 200 illustrated in FIG. 2, FIG. 3, and FIG. 4 as a processing target of the peeling apparatus 1 according to the first embodiment is formed of SiC, and is formed in a cylindrical shape as a whole. In the first embodiment, the ingot 200 is a hexagonal single crystal ingot.

As illustrated in FIG. 2, FIG. 3, and FIG. 4, the ingot 200 has a first surface 201 (corresponding to one surface) that is formed in a circular shape and that is a polished surface, a second surface 202 (corresponding to another surface) formed in a circular shape on the back side of the first surface 201, and a peripheral surface 203 connected to the outer edge of the first surface 201 and the outer edge of the second surface 202. In addition, the ingot 200 has, on the peripheral surface 203, a first orientation flat 204 indicating a crystal orientation of the ingot 200 and a second orientation flat 205 that is orthogonal to the first orientation flat 204 and that indicates the crystal orientation of the ingot 200. The orientation flats 204 and 205 are flat surfaces, and constitute straight lines as viewed in plan of the ingot 200. The length of the first orientation flat 204 is longer than the length of the second orientation flat 205.

In addition, the ingot 200 has a c-axis 208 inclined with respect to a normal 206 to the first surface 201 by an off angle α in an inclination direction 207 toward the second orientation flat 205 and a c-plane 209 orthogonal to the c-axis 208. The c-plane 209 is inclined with respect to the first surface 201 of the ingot 200 by the off angle α. The inclination direction 207 of the c-axis 208 from the normal 206 is orthogonal to the extending direction of the second orientation flat 205, and is parallel with the first orientation flat 204.

An infinite number of c-planes 209 are set in the ingot 200 on a molecular level of the ingot 200. In the first embodiment, the off angle α is set at 1°, 4°, or 6°. In the present invention, however, the ingot 200 can be manufactured with the off angle α set freely in a range of 1° to 6°, for example.

The first surface 201 of the ingot 200 is ground by a grinding apparatus, and is thereafter polished by a polishing apparatus. The first surface 201 is consequently formed into a mirror surface. A part on the first surface 201 side of the ingot 200 is peeled off, and the peeled part is manufactured as the wafer 220 illustrated in FIG. 5.

A part of the ingot 200 which part includes the first surface 201 is peeled off as the wafer 220 illustrated in FIG. 5, and a peel-off surface 221 (corresponding to another surface) at which the wafer 220 is peeled off from the ingot 200 is subjected to grinding and polishing or the like. Therefore, the wafer 220 has the first surface 201 and the peel-off surface 221. Devices are formed on the top surface of the wafer 220 after the wafer 220 is peeled off from the ingot 200.

In the first embodiment, the devices are metal-oxide-semiconductor field-effect transistors (MOSFETs), microelectromechanical systems (MEMS), or Schottky barrier diodes (SBDs). In the present invention, however, the devices are not limited to MOSFETs, MEMS, and SBDs. Incidentally, same parts of the wafer 220 as in the ingot 200 are identified by the same reference numerals, and description thereof will be omitted.

After a peel-off layer 211 illustrated in FIG. 6, FIG. 7, FIG. 8, and FIG. 9 is formed in the ingot 200 illustrated in FIG. 2, FIG. 3, and FIG. 4, a part of the ingot 200, that is, the wafer 220 to be manufactured is separated and peeled off from the ingot 200 with the peel-off layer 211 as a starting point. The peel-off layer 211 is formed by irradiating the ingot 200 with a pulsed laser beam 217 (illustrated in FIG. 6 and FIG. 7) having a wavelength transmissible through the ingot 200 while the ingot 200 is moved relative to the laser beam 217 along the second orientation flat 205 after a condensing point 218 of the laser beam 217 is positioned at a depth 213 (illustrated in FIG. 7) corresponding to a thickness 224 (illustrated in FIG. 5) of the wafer 220 to be manufactured from the first surface 201 of the ingot 200.

When the ingot 200 is irradiated with the laser beam 217, as illustrated in FIG. 9, a modified layer 214 in which SiC is separated into silicon (Si) and carbon (C), the pulsed laser beam 217 applied next is absorbed by C formed previously, and SiC is separated into Si and C in a chained manner is formed in the ingot 200 along the second orientation flat 205, and peel-off cracks 215 extending from the modified layer 214 along the c-plane 209 are generated. Thus, when the ingot 200 is irradiated with the pulsed laser beam 217 having a wavelength transmissible through the ingot 200, the peel-off layer 211 is formed in the ingot 200, the peel-off layer 211 including the modified layer 214 and the peel-off cracks 215 formed from the modified layer 214 along the c-plane 209 (corresponding to a crystal).

After the peel-off layer 211 is formed over the entire length of the second orientation flat 205, the ingot 200 is moved with respect to the laser beam 217 by a predetermined moving distance 219 along the first orientation flat 204 (which movement will hereinafter be written as index feeding). The condensing point 218 of the laser beam 217 is thereafter positioned at the above-described depth 213. The peel-off layer 211 is formed by irradiating the ingot 200 with the laser beam 217 while the ingot 200 is moved relative to the laser beam 217 along the second orientation flat 205. The irradiation of the ingot 200 with the laser beam 217 while the ingot 200 is moved with respect to the laser beam 217 along the second orientation flat 205 and the index feeding of the ingot 200 are alternately repeated until the peel-off layer 211 is formed in a whole part below the first surface 201. Thus, as illustrated in FIG. 8 and FIG. 9, the peel-off layer 211 is formed in the whole part below the first surface 201.

Thus, the peel-off layer 211 including the modified layer 214 and the peel-off cracks 215 extending from the modified layer 214 along the c-plane 209 is formed in the whole part below the first surface 201 of the ingot 200 by irradiating the exposed first surface 201 of the ingot 200 with the laser beam 217. In addition, a part of the ingot 200, that is, the wafer 220 is peeled off with the peel-off layer 211 as a starting point. A peel-off surface of the ingot 200 at which surface the wafer 220 is peeled off is thereafter formed into a mirror surface by grinding processing and polishing processing. The peel-off surface is thereby formed as the first surface 201. A peel-off layer 211 is formed again to peel off a wafer 220.

In this manner, the ingot 200 is reduced in thickness as the wafers 220 are peeled off. Until the ingot 200 has a predetermined thickness, peel-off layers 211 are formed, and wafers 220 are peeled off. In addition, the wafers 220 are a peeled wafer manufactured by irradiating the first surface 201 of the ingot 200 with the laser beam 217, thereby forming the peel-off layer 211 including the modified layer 214 and the peel-off cracks 215 extending from the modified layer 214 along the crystal, and peeling off the wafer from the ingot 200 with the peel-off layer 211 as a starting point. Moreover, in the present invention, the ingot 200 may have an off angle α of zero degrees, and the ingot 200 may be an ingot formed of a material other than SiC, such as gallium nitride (GaN), single crystal diamond, or single crystal Si.

The ingot 200 and the wafer 220 described above may have cracks 223 formed therein, as schematically illustrated in FIG. 10. The cracks 223 are minute spaces formed in the ingot 200 and the wafer 220. Therefore, the first surface 201 processed into a mirror surface is flat at positions coinciding in a thickness direction with positions at which no crack 223 is formed, but has invisibly minute protruding portions formed at positions coinciding in the thickness direction with the internally formed cracks 223. The planar shape of the minute protruding portions is substantially similar to the planar shape of the internally formed cracks 223.

(Peeling Apparatus)

Figure 11:
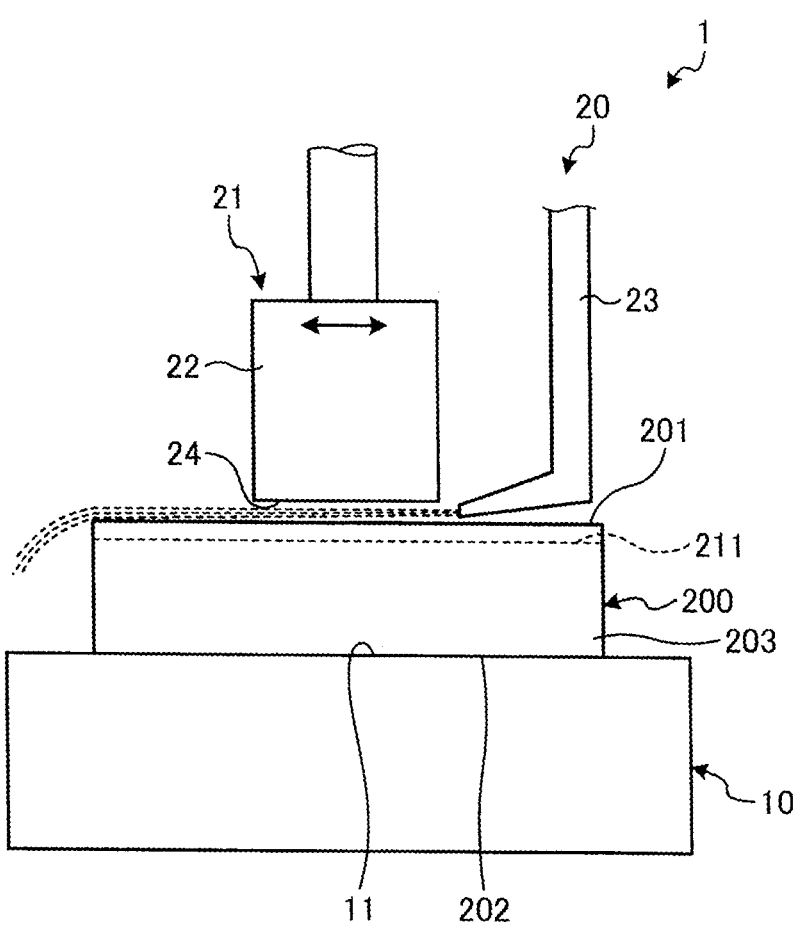
FIG. 11 is a side view illustrating an example of a configuration of an ultrasonic wave applying unit of a peeling unit of the peeling apparatus illustrated in FIG. 1.
Figure 12:
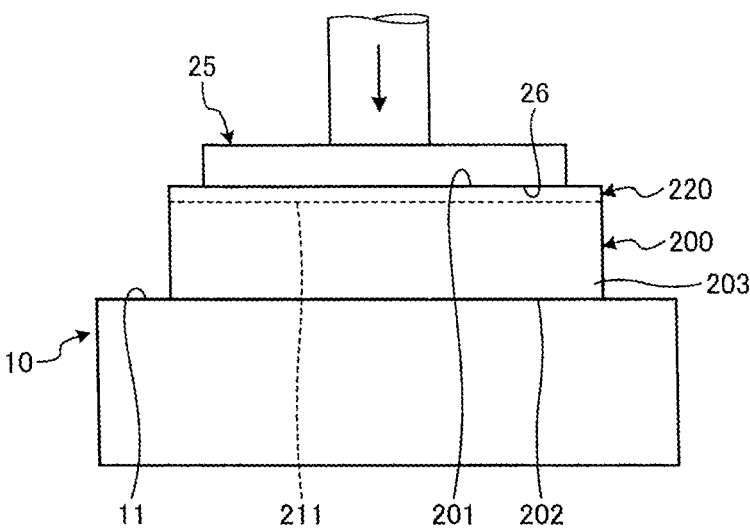
FIG. 12 is a side view illustrating an example of a configuration of a wafer peeling unit of the peeling unit of the peeling apparatus illustrated in FIG. 1.
Figure 13:
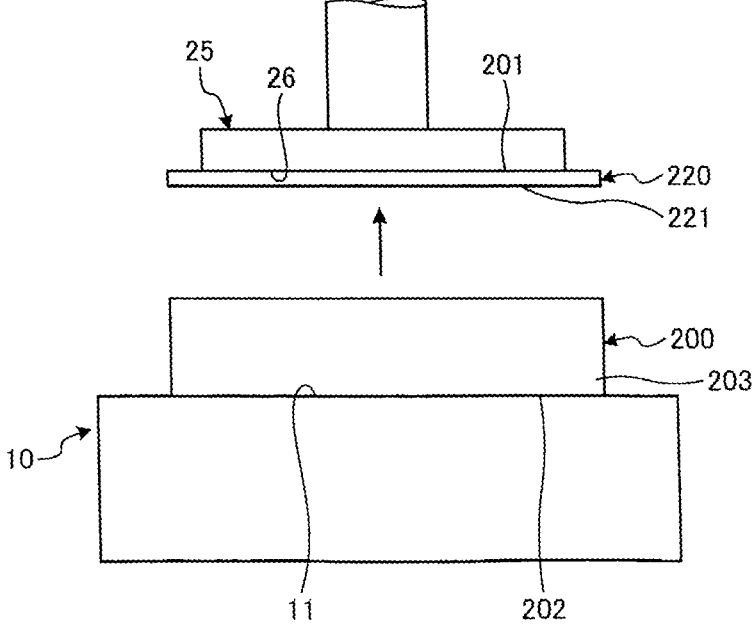
FIG. 13 is a side view illustrating a state in which the wafer peeling unit illustrated in FIG. 12 has peeled off the wafer from the ingot.
Figure 14:
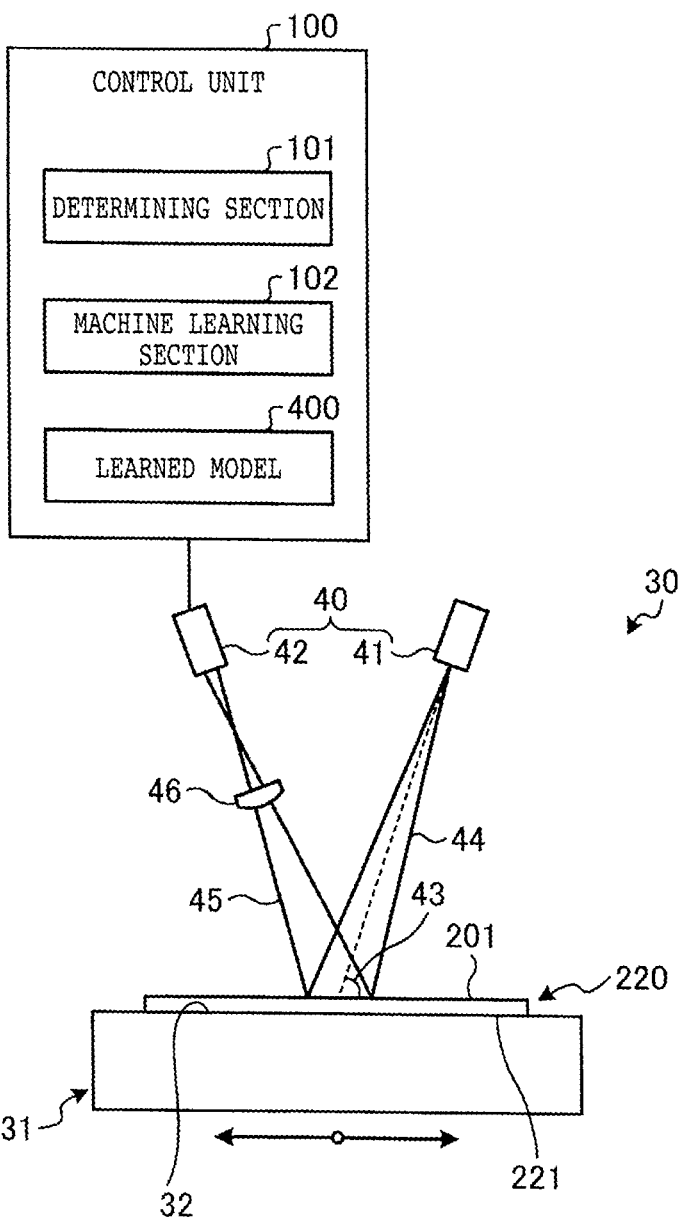
FIG. 14 is a side view schematically illustrating an example of a configuration of an inspecting unit of the peeling apparatus illustrated in FIG. 1.
Figure 15:
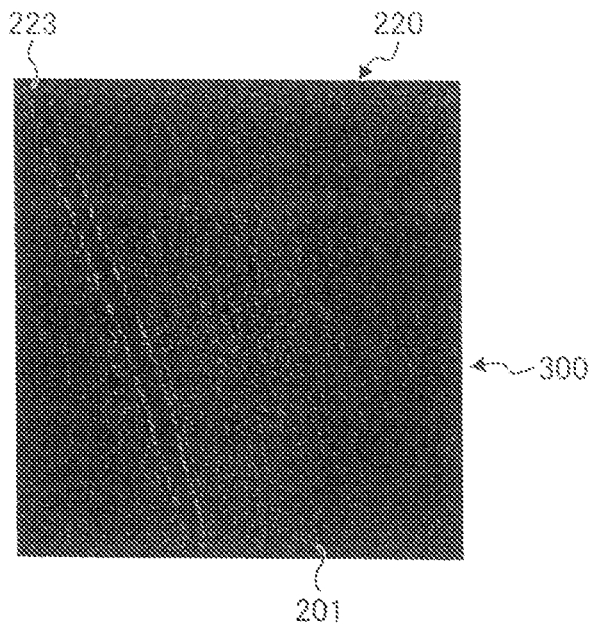
FIG. 15 is a diagram illustrating an example of a photographed image imaged by an imaging unit of the inspecting unit of the peeling apparatus illustrated in FIG. 1.

The peeling apparatus 1 illustrated in FIG. 1 according to the first embodiment is an apparatus that manufactures a wafer 220 by peeling off the wafer 220 from the ingot 200 with the peel-off layer 211 as a starting point. In the ingot 200, the peel-off layer 211 including the modified layer 214 and the peel-off cracks 215 extending from the modified layer 214 along the crystal is formed by irradiating the exposed first surface 201 with the laser beam 217. FIG. 11 is a side view illustrating an example of a configuration of an ultrasonic wave applying unit of a peeling unit of the peeling apparatus illustrated in FIG. 1. FIG. 12 is a side view illustrating an example of a configuration of a wafer peeling unit of the peeling unit of the peeling apparatus illustrated in FIG. 1. FIG. 13 is a side view illustrating a state in which the wafer peeling unit illustrated in FIG. 12 has peeled off the wafer from the ingot. FIG. 14 is a side view schematically illustrating an example of a configuration of an inspecting unit of the peeling apparatus illustrated in FIG. 1. FIG. 15 is a diagram illustrating an example of a photographed image imaged by an imaging unit of the inspecting unit of the peeling apparatus illustrated in FIG. 1.

As illustrated in FIG. 1, the peeling apparatus 1 includes a holding table 10, a peeling unit 20, and an inspecting unit 30 as an inspecting apparatus. The second surface 202 of the ingot 200 is mounted on a holding surface 11 of the holding table 10, and the holding table 10 holds under suction the ingot 200 mounted on the holding surface 11. The holding table 10 has a disk shape with the holding surface 11 formed along a horizontal direction and formed of a porous ceramic or the like. The holding surface 11 is connected to an unillustrated vacuum suction source via an unillustrated vacuum suction path. The holding surface 11 of the holding table 10 is sucked by the vacuum suction source, and the holding table 10 holds the ingot 200 under suction mounted on the holding surface 11. In addition, the holding table 10 is rotated by an unillustrated rotational driving source about an axis that passes through the center of the holding surface 11 and that is parallel with a vertical direction.

The peeling unit 20 peels off the wafer 220 from the ingot 200 held on the holding table 10. The peeling unit 20 includes an ultrasonic wave applying unit 21, a wafer peeling unit 25, and a moving unit 27.

The moving unit 27 includes a horizontal moving unit 28 that moves the ultrasonic wave applying unit 21 and the wafer peeling unit 25 in the horizontal direction and an unillustrated raising and lowering unit that raises and lowers each of the ultrasonic wave applying unit 21 and the wafer peeling unit 25. The moving unit 27 can position the ultrasonic wave applying unit 21 and the wafer peeling unit 25 above the holding table 10 by the horizontal moving unit 28. In addition, the moving unit 27 can position the wafer peeling unit 25 above a temporary placement table 31 of the inspecting unit 30.

As illustrated in FIG. 11, the ultrasonic wave applying unit 21 includes an ultrasonic wave oscillating unit 22 that is positioned above the ingot 200 held by the holding table 10 and faces the first surface 201 of the ingot 200 at an interval therebetween and a liquid supply unit 23 that supplies a liquid between the ultrasonic wave oscillating unit 22 and the first surface 201 of the ingot 200. The ultrasonic wave oscillating unit 22 includes an unillustrated ultrasonic vibrator which expands and contracts when alternating-current power is applied thereto, to thereby generate ultrasonic vibration at an opposed surface 24 opposed to the first surface 201 of the ingot 200.

In the ultrasonic wave applying unit 21, the ultrasonic wave oscillating unit 22 is positioned above the ingot 200 held on the holding table 10 by the horizontal moving unit 28 of the moving unit 27, and is lowered by the raising and lowering unit of the moving unit 27. The ultrasonic wave oscillating unit 22 thus faces the first surface 201 of the ingot 200 at an interval therebetween. In the ultrasonic wave applying unit 21, the liquid supply unit 23 supplies a liquid between the first surface 201 of the ingot 200 and the ultrasonic wave oscillating unit 22, and the ultrasonic wave oscillating unit 22 is immersed in the liquid on the first surface 201 of the ingot 200. The ultrasonic wave applying unit 21 ultrasonically vibrates the opposed surface 24 by applying alternating-current power to the ultrasonic vibrator of the ultrasonic wave oscillating unit 22 for a predetermined time.

The ultrasonic wave applying unit 21 transmits the ultrasonic vibration of the opposed surface 24 to the first surface 201 of the ingot 200 via the liquid 51, and thereby applies an ultrasonic wave to the first surface 201 of the ingot 200 held on the holding table 10. Then, the ultrasonic wave from the ultrasonic wave oscillating unit 22 stimulates the peel-off layer 211, divides the ingot 200 with the peel-off layer 211 as a starting point, and separates the wafer 220 to be manufactured from the ingot 200.

When the ultrasonic wave applying unit 21 ultrasonically vibrates the opposed surface 24 by applying alternating-current power to the ultrasonic vibrator of the ultrasonic wave oscillating unit 22 for a predetermined time and consequently separates the wafer 220 to be manufactured from the ingot 200, the ultrasonic wave applying unit 21 stops the application of the alternating-current power to the ultrasonic vibrator of the ultrasonic wave oscillating unit 22, and stops the supply of the liquid from the liquid supply unit 23. The ultrasonic wave applying unit 21 is raised by the raising and lowering unit of the moving unit 27, and is retreated from above the ingot 200 held on the holding table 10 by the horizontal moving unit 28.

The wafer peeling unit 25 holds under suction the first surface 201 of the ingot 200 held on the holding surface 11 of the holding table 10, that is, the wafer peeling unit 25 holds under suction the wafer 220. The wafer peeling unit 25 has a lower surface 26 connected to an unillustrated vacuum suction source via an unillustrated vacuum suction path. The lower surface 26 of the wafer peeling unit 25 is sucked by the vacuum suction source, and the wafer peeling unit 25 thereby holds under suction the first surface 201 of the ingot 200, the first surface 201 abutting against the lower surface 26, that is, the wafer peeling unit 25 holds the wafer 220 under suction.

The wafer peeling unit 25 is positioned above the ingot 200 held on the holding table 10 by the horizontal moving unit 28 of the moving unit 27, and is lowered by the raising and lowering unit of the moving unit 27. Thus, as illustrated in FIG. 12, the lower surface 26 comes into contact with the first surface 201 of the ingot 200. The wafer peeling unit 25 is sucked by the vacuum suction source, and holds under suction the first surface 201 of the ingot 200, that is, the wafer 220, on the lower surface 26.

The wafer peeling unit 25 is raised by the raising and lowering unit of the moving unit 27, and thereby separates the wafer 220 held under suction on the lower surface 26 from the ingot 200, as illustrated in FIG. 13. The wafer peeling unit 25 is positioned above the temporary placement table 31 of the inspecting unit 30 by the horizontal moving unit 28 of the moving unit 27, is lowered by the raising and lowering unit of the moving unit 27, and mounts the wafer 220 held under suction, onto the temporary placement table 31. After the wafer peeling unit 25 stops holding the wafer 220 under suction, the wafer peeling unit 25 is raised by the raising and lowering unit of the moving unit 27, and is retreated from above the temporary placement table 31 by the horizontal moving unit 28.

In the first embodiment, the inspecting unit 30 is an apparatus that inspects the wafer 220. In the first embodiment, the inspecting unit 30 is an apparatus that inspects whether or not the wafer 220 has a crack 223 on the basis of the principle of a magic mirror. As illustrated in FIG. 14, the inspecting unit 30 includes the temporary placement table 31 as a holding table, a photographed image forming unit 40, and a control unit 100 as a determining section.

The wafer 220 peeled off by the peeling unit 20 is temporarily placed on the temporary placement table 31, and the temporary placement table 31 holds the wafer 220 with the first surface 201 of the wafer 220 exposed. The peel-off surface 221 of the wafer 220 is mounted on a holding surface 32 of the temporary placement table 31 which holding surface 32 is parallel with the horizontal direction, and the temporary placement table 31 holds the wafer 220 mounted on the holding surface 32.

As illustrated in FIG. 14, the photographed image forming unit 40 includes a light source 41 and an imaging unit 42. The light source 41 irradiates the first surface 201 of the wafer 220 held on the temporary placement table 31 with light 44 of a visible beam at a predetermined incidence angle 43 (angle smaller than 90 degrees in the first embodiment).

The imaging unit 42 condenses, by a condensing lens 46, reflected light 45 of the light 44 reflected by the first surface 201 of the wafer 220 held on the temporary placement table 31, and photographs the reflected light 45. The imaging unit 42 thereby forms a photographed image 300, an example of which is illustrated in FIG. 15. The imaging unit 42 includes an imaging element that photographs the reflected light. The imaging element is, for example, a charge-coupled device (CCD) imaging element or a complementary MOS (CMOS) imaging element. The photographed image 300 formed by the imaging unit 42 by photographing the reflected light 45 is a gray scale image in which the light amount of the reflected light 45 is defined by gradations at a plurality of levels (for example, 256 gradations).

As described above, when a crack 223 is formed in the wafer 220, a minute protruding portion is formed at a position of the first surface 201 which position coincides in the thickness direction with the crack 223. In addition, the first surface 201 of the wafer 220 is subjected to mirror surface processing, and the wafer 220 is flat at positions not coinciding in the thickness direction with the crack 223. Therefore, the reflected light 45 of the light 44 from the light source 41 is scattered or diffused by the protruding portion at the position of the first surface 201 which position coincides in the thickness direction with the crack 223, and in the photographed image 300 imaged by the imaging unit 42, the reflected light 45 from the position of the first surface 201 which position coincides in the thickness direction with the crack 223 is weaker than the reflected light 45 from a position of the first surface 201 which position does not coincide in the thickness direction with the crack 223.

In the photographed image 300, an example of which is illustrated in FIG. 15, the position of the first surface 201 which position coincides in the thickness direction with the crack 223 is darker than the position of the first surface 201 which position does not coincide in the thickness direction with the crack 223. Thus, the photographed image 300 formed by the imaging unit 42 by imaging the reflected light 45 is an image that emphasizes unevenness produced on the first surface 201 by the crack 223 extending in the wafer 220. The imaging unit 42 outputs the formed photographed image 300 to the control unit 100.

Incidentally, in the first embodiment, the imaging unit 42 photographs the reflected light 45 from within a 20 mm square range of the first surface 201, and forms the photographed image 300 within the 20 mm square range of the first surface 201. As compared with the application of light to a wide region such as the whole surface of the wafer, light is applied only to a small range. Thus, an image with sufficient light and shade can be obtained by using a small light source.

In addition, the inspecting unit 30 according to the first embodiment includes an unillustrated table moving unit that moves the temporary placement table 31 relative to the inspecting unit 30 in two directions parallel with the horizontal direction and orthogonal to each other. The inspecting unit 30 according to the first embodiment photographs the first surface 201 of the wafer 220 held on the temporary placement table 31, such that the first surface 201 is divided into a plurality of photographed images 300 by moving the temporary placement table 31 relative to the inspecting unit 30 in the two directions parallel with the horizontal direction and orthogonal to each other by the table moving unit.

(Control Unit)

Figure 16:
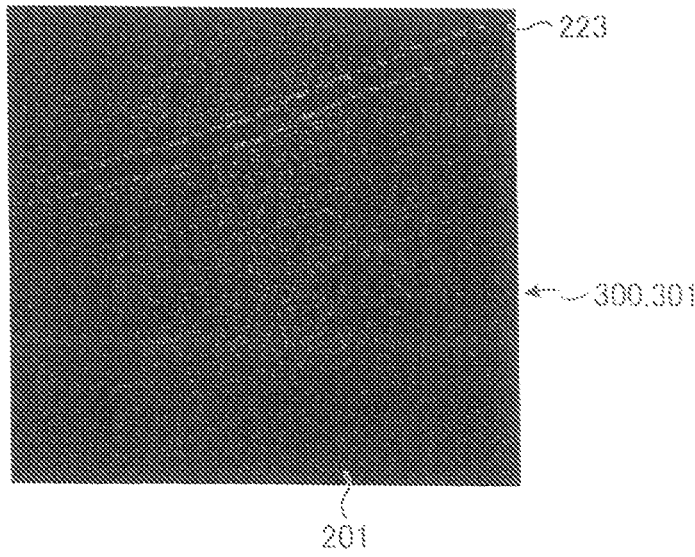
FIG. 16 is a diagram illustrating an example of a first photographed image including a crack for generating a learned model provided to a control unit of the inspecting unit of the peeling apparatus illustrated in FIG. 1.
Figure 17:
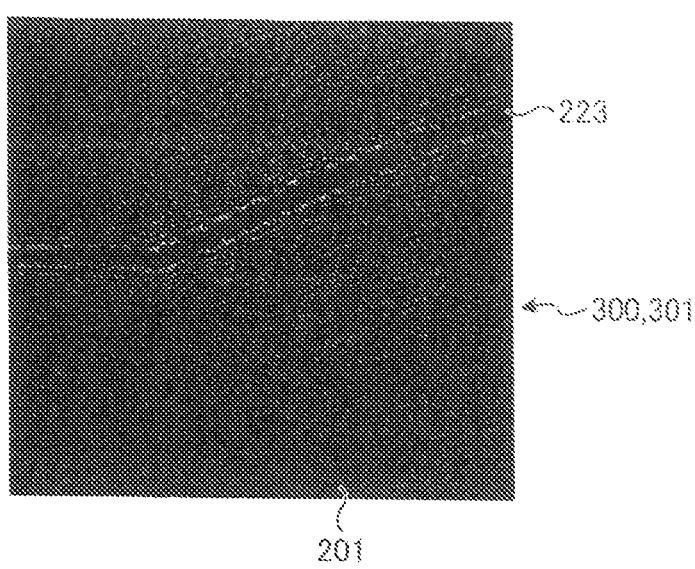
FIG. 17 is a diagram illustrating another example of the first photographed image including a crack for generating the learned model provided to the control unit of the inspecting unit of the peeling apparatus illustrated in FIG. 1.
Figure 18:
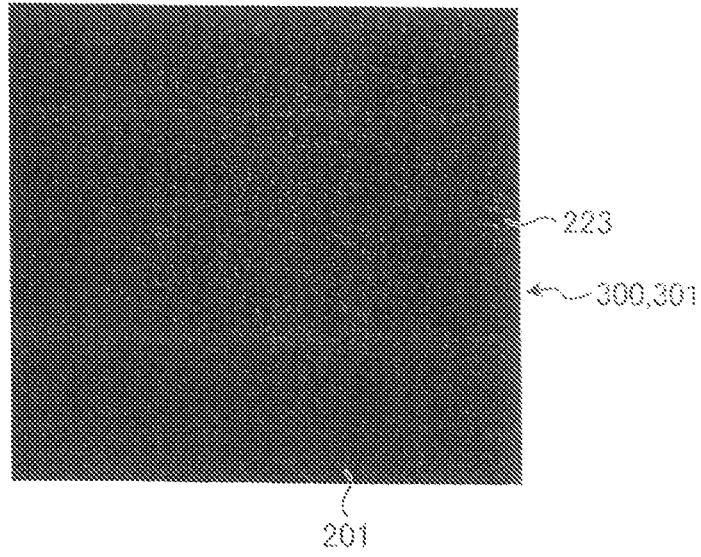
FIG. 18 is a diagram illustrating still another example of the first photographed image including a crack for generating the learned model provided to the control unit of the inspecting unit of the peeling apparatus illustrated in FIG. 1.
Figure 19:
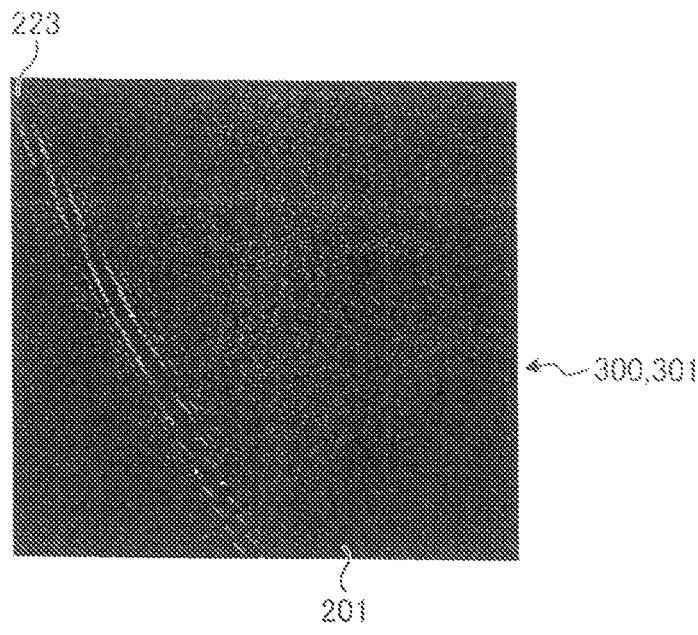
FIG. 19 is a diagram illustrating yet another example of the first photographed image including a crack for generating the learned model provided to the control unit of the inspecting unit of the peeling apparatus illustrated in FIG. 1.
Figure 20:
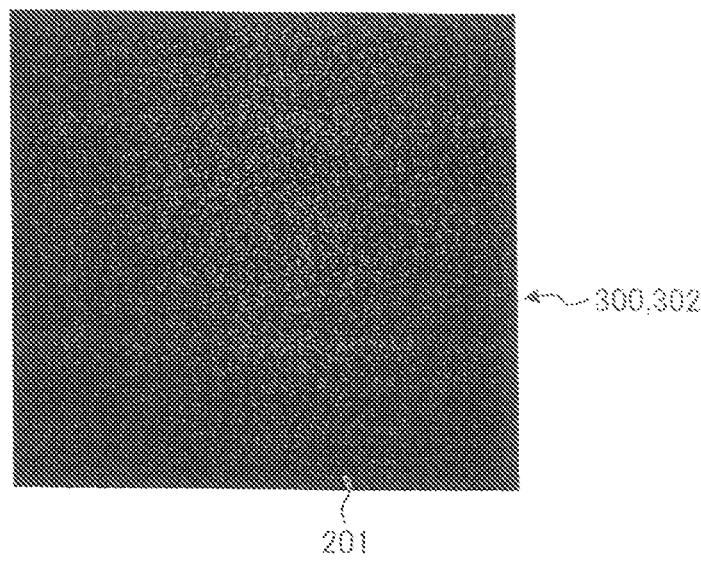
FIG. 20 is a diagram illustrating an example of a second photographed image without a crack for generating the learned model provided to the control unit of the inspecting unit of the peeling apparatus illustrated in FIG. 1.
Figure 21:
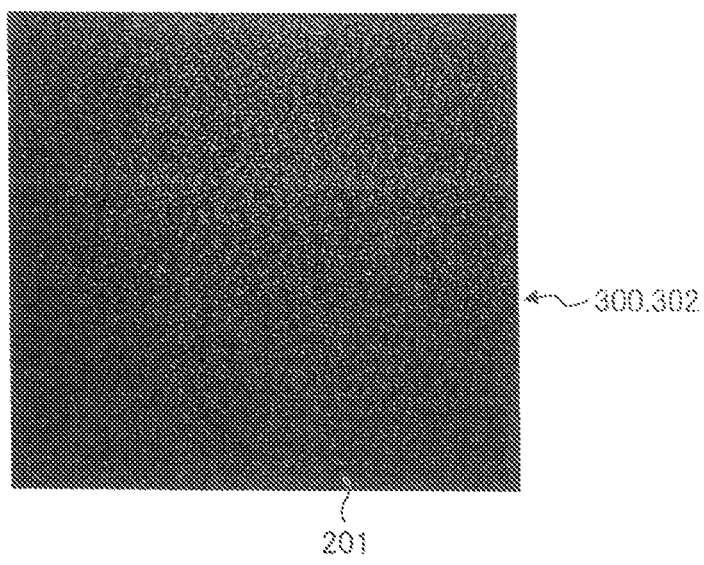
FIG. 21 is a diagram illustrating another example of the second photographed image without a crack for generating the learned model provided to the control unit of the inspecting unit of the peeling apparatus illustrated in FIG. 1.
Figure 22:
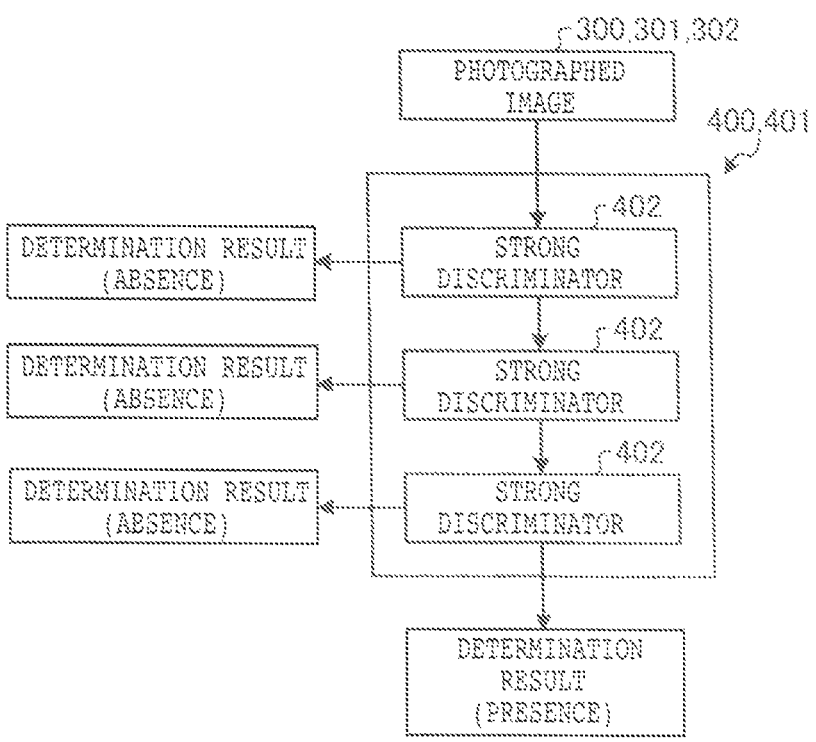
FIG. 22 is a diagram of assistance in explaining a configuration of the learned model provided to the control unit of the inspecting unit of the peeling apparatus illustrated in FIG. 1.
Figure 23:
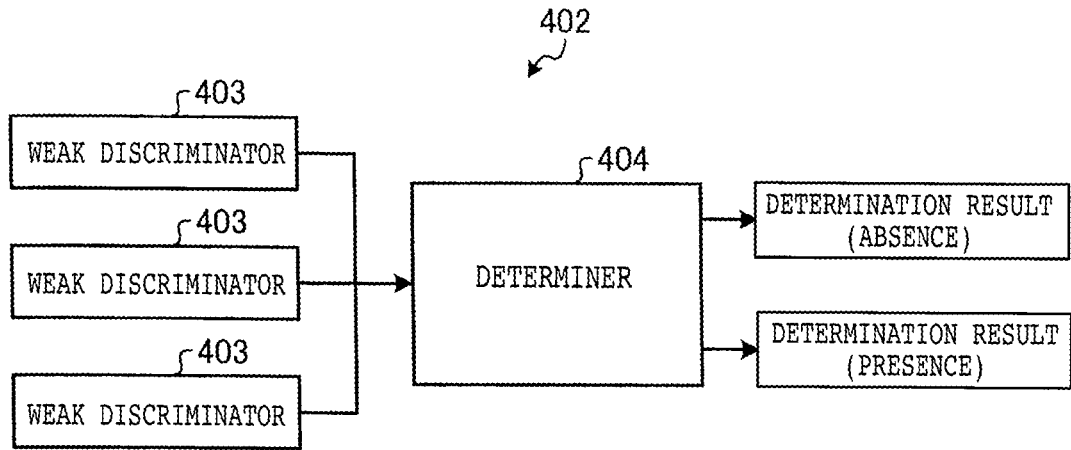
FIG. 23 is a diagram of assistance in explaining a configuration of a strong discriminator of the learned model illustrated in FIG. 22.

FIG. 16 is a diagram illustrating an example of a first photographed image including a crack for generating a learned model provided to a control unit of the inspecting unit of the peeling apparatus illustrated in FIG. 1. FIG. 17 is a diagram illustrating another example of the first photographed image including a crack for generating the learned model provided to the control unit of the inspecting unit of the peeling apparatus illustrated in FIG. 1. FIG. 18 is a diagram illustrating still another example of the first photographed image including a crack for generating the learned model provided to the control unit of the inspecting unit of the peeling apparatus illustrated in FIG. 1. FIG. 19 is a diagram illustrating yet another example of the first photographed image including a crack for generating the learned model provided to the control unit of the inspecting unit of the peeling apparatus illustrated in FIG. 1. FIG. 20 is a diagram illustrating an example of a second photographed image without a crack for generating the learned model provided to the control unit of the inspecting unit of the peeling apparatus illustrated in FIG. 1. FIG. 21 is a diagram illustrating another example of the second photographed image without a crack for generating the learned model provided to the control unit of the inspecting unit of the peeling apparatus illustrated in FIG. 1. FIG. 22 is a diagram of assistance in explaining a configuration of the learned model provided to the control unit of the inspecting unit of the peeling apparatus illustrated in FIG. 1. FIG. 23 is a diagram of assistance in explaining a configuration of a strong discriminator of the learned model illustrated in FIG. 22.

The control unit 100 controls each of the above-described constituent units constituting the peeling apparatus 1. That is, the control unit 100 makes the peeling apparatus 1 and the inspecting unit 30 perform a processing operation on the ingot 200 and an inspecting operation on the wafer 220. The control unit 100 is a computer including an arithmetic processing device including a microprocessor such as a central processing unit (CPU), a storage device including a memory such as a read only memory (ROM) or a random access memory (RAM), and an input-output interface device.

The arithmetic processing device of the control unit 100 performs arithmetic processing according to a computer program stored in the storage device, and outputs control signals for controlling the peeling apparatus 1 to the above-described constituent elements of the peeling apparatus 1 via the input-output interface device. In addition, the control unit 100 is connected to a display unit constituted by a liquid crystal display device or the like that displays a state of processing operation, an image, or the like, an input unit used when an operator registers processing content information or the like, and a notifying unit that notifies the operator. The input unit is formed by at least one of a touch panel provided to the display unit, a keyboard, and the like. The notifying unit notifies the operator by issuing at least one of sound, light, and a message on the touch panel.

In addition, as illustrated in FIG. 14, the control unit 100 includes a determining section 101 that determines the state of the wafer 220 by comparing the photographed image 300 formed by the imaging unit 42 with a preset condition. Specifically, the determining section 101 of the control unit 100 stores and includes, in the storage device, a learned model 400 configured by machine learning to output, when the photographed image 300 obtained by the imaging unit 42 is input, a determination result indicating whether or not a crack 223 is formed in the wafer 220, and the determining section 101 determines the presence or absence of a crack 223 in the photographed image 300 formed by the imaging unit 42, by using the learned model 400.

In the first embodiment, the learned model 400 is generated by using a cascade classifier 401 (illustrated in FIG. 22) made to learn images of cracks 223 on the basis of sample images including photographed images 300 including cracks 223 as illustrated in FIG. 16, FIG. 17, FIG. 18, and FIG. 19 (which photographed images will hereinafter be indicated by a reference numeral 301, will be described as a first photographed image, and correspond to a first learning image) and photographed images 300 without cracks 223 as illustrated in FIG. 20 and FIG. 21 (which photographed images will hereinafter be indicated by a reference numeral 302, will be described as a second photographed image, and correspond to a second learning image).

The cascade classifier 401 of the learned model 400 is to determine the presence or absence of a crack 223 in a photographed image 300 when the photographed image 300 is input. As illustrated in FIG. 22, the cascade classifier 401 of the learned model 400 includes a plurality of strong discriminators 402. As illustrated in FIG. 23, each of the strong discriminators 402 includes a plurality of weak discriminators 403 and a determiner 404.

A weak discriminator 403 determines whether or not a feature quantity of the photographed image 300 (which feature quantity in the first embodiment is the received light amount of a pixel at which the light amount of the reflected light is weakest among pixels constituting the photographed image 300) is less than a threshold value generated by machine learning. When the feature quantity is less than the threshold value, the weak discriminator 403 outputs a signal indicating 1 to the determiner 404. When the feature quantity is not less than the threshold value, the weak discriminator 403 outputs a signal indicating 0 to the determiner 404.

The determiner 404 calculates values obtained by multiplying signals output by the respective weak discriminators 403 by a coefficient generated by machine learning, and calculates a value (hereinafter written as a total value) obtained by summing the values obtained by multiplying the signals output by the respective weak discriminators 403 by the coefficient generated by machine learning. The determiner 404 determines whether or not the total value exceeds a second threshold value generated by machine learning. When the determiner 404 determines that the total value exceeds the second threshold value, the determiner 404 outputs a determination result that there is a crack 223 in the photographed image 300. When the determiner 404 determines that the total value does not exceed the second threshold value, the determiner 404 outputs a determination result that there is no crack 223 in the photographed image 300.

The cascade classifier 401 of the learned model 400 determines the presence or absence of a crack 223 in the photographed image 300 in each of the plurality of strong discriminators 402 in order. When one of the plurality of strong discriminators 402 outputs a determination result that there is no crack 223 in the photographed image 300, the cascade classifier 401 of the learned model 400 outputs the determination result that there is no crack 223 in the input photographed image 300 without determining the presence or absence of the a crack 223 in a strong discriminator(s) 402 subsequent to the strong discriminator 402 that has output the determination result that there is no crack 223. When all of the strong discriminators 402 output a determination result that there is a crack 223 in the photographed image 300, the cascade classifier 401 of the learned model 400 outputs the determination result that there is a crack 223 in the input photographed image 300.

Incidentally, while FIG. 22 illustrates three strong discriminators 402, the cascade classifier 401 of the learned model 400 in the present invention may include two strong discriminators 402 or four or more strong discriminators 402. In addition, while FIG. 23 illustrates three weak discriminators 403, the strong discriminator 402 in the present invention may include two weak discriminators 403 or four or more weak discriminators 403.

In addition, the control unit 100 includes a machine learning section 102. In the first embodiment, the machine learning section 102 is made to machine-learn the first photographed images 301 including cracks 223 and the second photographed images 302 without cracks 223 on the basis of the first photographed images 301 and the second photographed images 302 by using the cascade classifier 401, and thereby generates the learned model 400 and stores the learned model 400 in the storage device. Incidentally, the functions of the determining section 101 and the machine learning section 102 are implemented by the arithmetic processing device by performing arithmetic processing according to the computer program stored in the storage device.

(Learned Model Generating Method)

Figure 24:
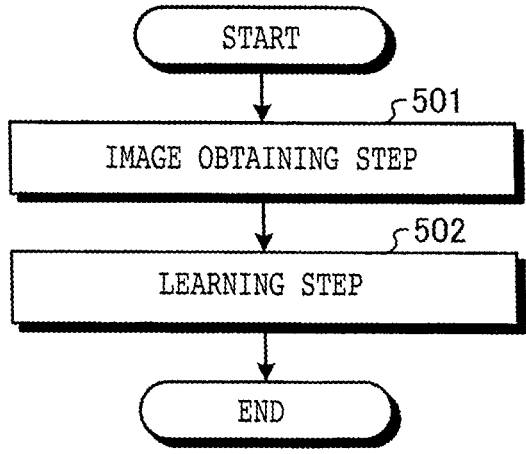
FIG. 24 is a flowchart illustrating a flow of a learned model generating method according to the first embodiment.

A learned model generating method will next be described. FIG. 24 is a flowchart illustrating a flow of the learned model generating method according to the first embodiment. The learned model generating method is a method of generating the learned model 400 that determines the state of the wafer that has the first surface 201 and the second surface 202 and whose first surface 201 is a polished surface resulting from polishing. As illustrated in FIG. 24, the learned model generating method includes an image obtaining step 501 and a learning step 502.

The image obtaining step 501 is a step of obtaining the first photographed images 301 (illustrated in FIG. 16, FIG. 17, FIG. 18, and FIG. 19) as a plurality of first learning images corresponding to an image of a sample including a crack 223 and the second photographed images 302 (illustrated in FIG. 20 and FIG. 21) as a plurality of second learning images corresponding to an image of the sample not including a crack, by photographing the wafer 220 as the sample by irradiating the first surface 201 with the light 44 from the light source 41 at a predetermined incidence angle and condensing and photographing the reflected light 45 as the light reflected by the first surface 201.

In the image obtaining step 501, the inspecting unit 30 has the wafer 220 mounted on the temporary placement table 31, applies the light 44 from the light source 41 to the wafer 220 on the temporary placement table 31, condenses and images the reflected light 45 by the imaging unit 42, and thereby obtains a predetermined number of first photographed images 301 and a predetermined number of second photographed images 302. In the first embodiment, the image obtaining step 501 obtains 7000 first photographed images 301, and obtains 3000 second photographed images 302. However, there is no limitation on the number of photographed images to be obtained.

The learning step 502 is a step of generating, by machine learning using the first photographed images 301 and the second photographed images 302, the learned model 400 that outputs, when a photographed image 300 (corresponding to an image) of the wafer 220 is input, a determination result indicating whether or not a crack 223 is formed in the wafer 220. In the learning step 502, the machine learning section 102 of the control unit 100 is made to machine-learn the photographed images 301 and 302. Specifically, in the learning step 502, the second photographed images 302 obtained in the image obtaining step 501 and information indicating that there is no crack 223 are input to the machine learning section 102 of the control unit, and the first photographed images 301 obtained in the image obtaining step 501 and information indicating the positions of cracks 223 in the first photographed images 301 are input to the machine learning section 102 of the control unit.

Then, in the learning step 502, the machine learning section 102 of the control unit 100 generates the threshold value and coefficient of each of the weak discriminators 403 and the second threshold value of each of the strong discriminators 402. The machine learning section 102 thereby generates the learned model 400, and stores the learned model 400 in the storage device. In the first embodiment, the learned model 400 generated by the learned model generating method uses the cascade classifier 401 made to learn the first photographed images 301 of cracks 223 (which images corresponding to an image) on the basis of the first photographed images 301 and the second photographed images 302.

Description will next be made of processing operation of the peeling apparatus 1 according to the first embodiment. First, in the peeling apparatus 1, the control unit 100 receives and stores processing conditions. When the second surface 202 of the ingot 200 in which the peel-off layer 211 is formed is mounted on the holding table 10 and the control unit 100 receives an instruction to start the processing operation from the operator, the peeling apparatus 1 starts an inspecting operation.

In the processing operation, the control unit 100 of the peeling apparatus 1 holds the ingot 200 under suction on the holding surface 11 of the holding table 10. The control unit 100 controls the peeling unit 20, the moving unit 27, and the like, so that the peeling apparatus 1 peels off the wafer 220 from the ingot 200, and mounts the peeled wafer 220 on the temporary placement table 31.

In the processing operation, the control unit 100 of the peeling apparatus 1 forms photographed images 300 of the first surface 201 of the wafer 220 mounted on the temporary placement table 31 by controlling the inspecting unit 30. In the processing operation, the determining section 101 of the control unit 100 in the peeling apparatus 1 determines whether or not there is a crack 223 in each photographed image 300 by using the learned model 400, and thereby determines whether or not there is a crack 223 in the wafer 220 as an inspection target.

As described above, in the peeling apparatus 1 and the inspecting unit 30 as the inspecting apparatus according to the first embodiment, the determining section 101 of the control unit 100 determines the presence or absence of a crack 223 whose shape is not fixed, by using the learned model 400 configured by machine learning. As a result, the peeling apparatus 1 and the inspecting unit 30 as the inspecting apparatus according to the first embodiment produce an effect of being able to detect the crack 223 that occurs in the wafer 220 and whose shape is not fixed.

In addition, in the peeling apparatus 1 and the inspecting unit 30 as the inspecting apparatus according to the first embodiment, the light source 41 of the photographed image forming unit 40 irradiates the first surface 201 of the wafer 220 held on the temporary placement table 31 with the light 44 as a visible beam at the predetermined incidence angle 43, and the imaging unit 42 condenses, by the condensing lens 46, the reflected light 45 reflected by the first surface 201 of the wafer 220 held on the temporary placement table 31, photographs the reflected light 45, and forms a photographed image 300 on the basis of the principle of what is generally called the magic mirror. As a result, the peeling apparatus 1 and the inspecting unit 30 as the inspecting apparatus according to the first embodiment produce an effect of being able to photograph a crack 223 in the wafer 220 easily by using the principle of the magic mirror.

The peeling apparatus 1 and the inspecting unit 30 as the inspecting apparatus according to the first embodiment use the cascade classifier 401 such that the learned model 400 determines the presence or absence of a crack 223 in the photographed image 300 in each of the plurality of strong discriminators 402 in order and, when one of the plurality of strong discriminators 402 outputs a determination result that there is no crack 223 in the photographed image 300, the cascade classifier 401 outputs the determination result that there is no crack 223 in the input photographed image 300 without determining the presence or absence of a crack 223 in a strong discriminator(s) 402 subsequent to the strong discriminator 402 that has output the determination result that there is no crack 223. Thus, the peeling apparatus 1 and the inspecting unit 30 as the inspecting apparatus according to the first embodiment can achieve an increase in speed of the processing when there is no crack 223 in the photographed image 300.

Second Embodiment

Figure 25:
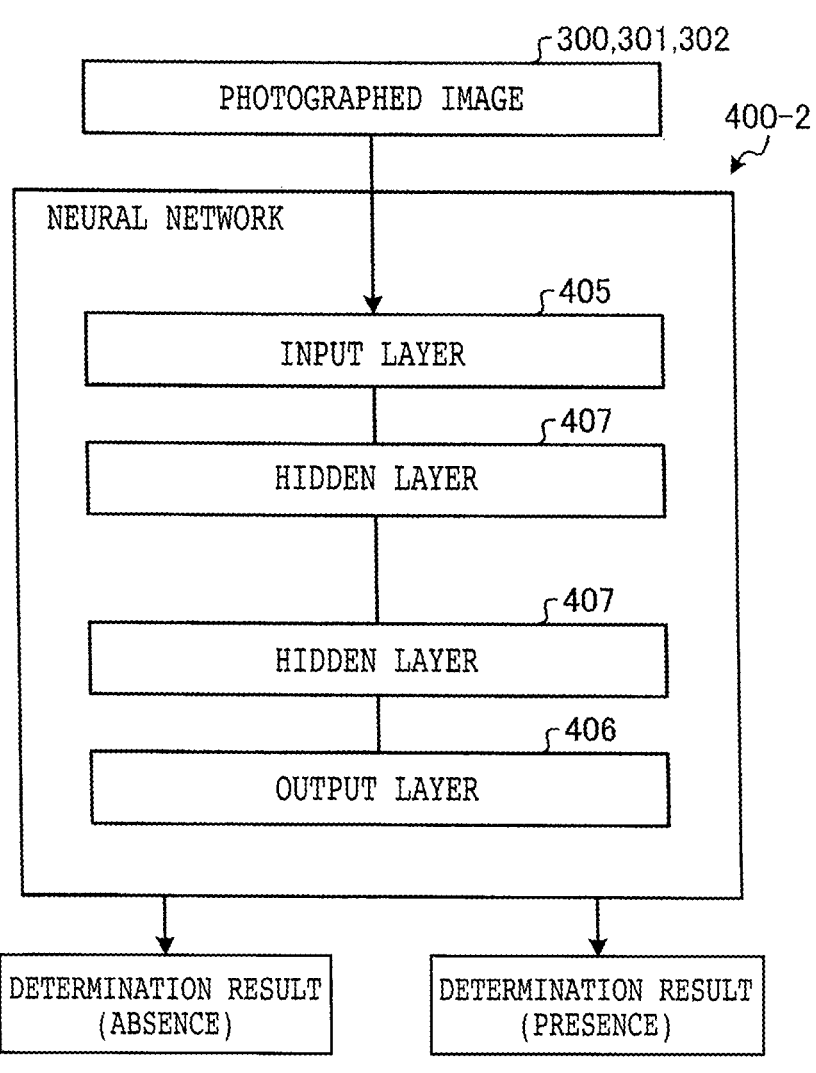
FIG. 25 is a diagram of assistance in explaining a configuration of a learned model provided to a control unit of an inspecting unit of a peeling apparatus according to a second embodiment.

A peeling apparatus according to a second embodiment of the present invention will be described with reference to the drawings. FIG. 25 is a diagram of assistance in explaining a configuration of a learned model provided to a control unit of an inspecting unit of the peeling apparatus according to the second embodiment. The peeling apparatus 1 according to the second embodiment is the same as that according to the first embodiment except for a different learned model 400-2 that is generated by the machine learning section 102 of the control unit 100 and stored in the storage device and that outputs a determination result indicating whether or not a crack 223 is formed in the wafer 220.

As illustrated in FIG. 25, the learned model 400-2 of the peeling apparatus 1 and the inspecting unit 30 according to the second embodiment is a neural network including an input layer 405 to which photographed images 300, 301, and 302 are input and an output layer 406 that outputs a determination result. The learned model 400 is a learned model learned by deep learning. The learned model 400 includes a model (configuration information of the neural network) defining the neural network constituting a classifier learned by deep learning and variables.

Deep learning is a method of machine learning, and, for example, includes a neural network of a plurality of layers in a narrow sense. In the second embodiment, the learned model 400 is a fully connected neural network model, and includes the input layer 405, hidden layers 407, and the output layer 406. When a photographed image 300 is input to the input layer 405, the learned model 400 performs operation in the hidden layers 407, and outputs a determination result indicating whether or not there is a crack 223 in the photographed image 300 from the output layer 406. In FIG. 25, the learned model 400 has two hidden layers 407. However, the number of hidden layers 407 is not limited to two, and can be any number.

In the learning step 502 of a learned model generating method for generating the learned model 400 in the second embodiment, the machine learning section 102 of the control unit 100 inputs, to the input layer 405, the second photographed images 302 obtained in the image obtaining step 501 and information indicating that there is no crack 223, and the machine learning section 102 of the control unit 100 inputs, to the input layer 405, the first photographed images 301 obtained in the image obtaining step 501 and information indicating the positions of cracks 223 in the first photographed images 301. Then, in the learning step 502, the machine learning section 102 of the control unit 100 generates variables, and generates the learned model 400-2 and stores the learned model 400-2 in the storage device.

In the processing operation, as in the first embodiment, the determining section 101 of the control unit 100 in the peeling apparatus 1 according to the second embodiment determines whether or not there is a crack 223 in each photographed image 300 by using the learned model 400-2, and thereby determines whether or not there is a crack 223 in the wafer 220 as an inspection target.

In the peeling apparatus 1 and the inspecting unit 30 as the inspecting apparatus according to the second embodiment, the determining section 101 of the control unit 100 determines the presence or absence of a crack 223 whose shape is not fixed, by using the learned model 400-2 configured by machine learning. Thus, the peeling apparatus 1 and the inspecting unit 30 as the inspecting apparatus according to the second embodiment produce an effect of being able to detect the crack 223 that occurs in the wafer 220.

In addition, as in the first embodiment, the peeling apparatus 1 and the inspecting unit 30 as the inspecting apparatus according to the second embodiment produce an effect of being able to photograph the crack 223 in the wafer 220 easily by using the principle of what is generally called the magic mirror in order to form a photographed image 300 on the basis of the principle of the magic mirror.

[Modification]

Figure 26:
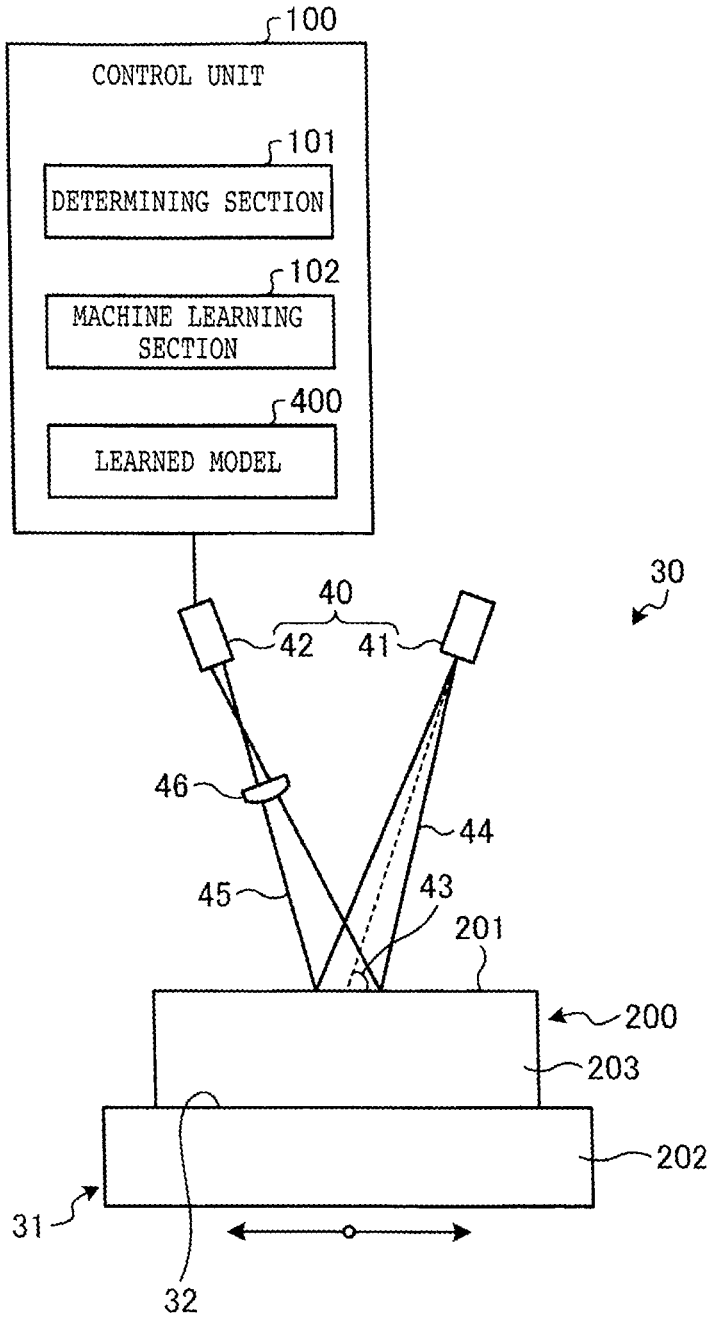
FIG. 26 is a side view schematically illustrating an example of a configuration of an inspecting unit of a peeling apparatus according to a modification of the first embodiment and the second embodiment of the present invention.

A peeling apparatus according to a modification of the first embodiment and the second embodiment of the present invention will be described with reference to the drawings. FIG. 26 is a side view schematically illustrating an example of a configuration of an inspecting unit of the peeling apparatus according to the modification of the first embodiment and the second embodiment of the present invention. Incidentally, in FIG. 26, the same parts as in the first embodiment are identified by the same reference numerals, and description thereof will be omitted.

The inspecting unit 30 of the peeling apparatus 1 according to the modification is the same as that according to the first embodiment except that the second surface 202 of the ingot 200 is mounted on the temporary placement table 31, the first surface 201 of the ingot 200 is irradiated with light from the light source 41, the reflected light 45 is condensed and imaged by the imaging unit 42, and photographed images 300, 301, and 302 are formed. That is, in the modification, the temporary placement table 31 holds the ingot 200 with the first surface 201 of the ingot 200 exposed, the light source 41 irradiates the first surface 201 of the ingot 200 held by the temporary placement table 31 with the light 44 at the predetermined incidence angle 43, the imaging unit 42 condenses and photographs the reflected light 45 reflected by the first surface 201 of the ingot 200, and forms a photographed image 300 emphasizing unevenness produced on the first surface 201 by a crack 223 extending in the ingot 200, the determining section 101 determines the state of the ingot 200 by comparing the formed photographed image 300 with a preset condition, and the determining section 101 includes the learned model 400 configured by machine learning to output, when the photographed image 300 obtained by the imaging unit 42 is input, a determination result indicating whether or not a crack 223 is formed in the ingot 200.

In addition, a learned model generating method in the modification is a method of generating the learned model 400 that determines the state of the ingot 200. In the learned model generating method, the image obtaining step 501 is a step of obtaining a plurality of first photographed images 301 corresponding to an image of a sample including a crack and a plurality of second photographed images 302 corresponding to an image of the sample including no crack, by photographing the ingot 200 as the sample by irradiating the first surface 201 with the light 44 from the light source 41 at the predetermined incidence angle 43 and condensing and photographing the reflected light 45 reflected by the first surface 201, and the learning step 502 is a step of generating, by machine learning using the first photographed images 301 and the second photographed images 302, the learned model 400 that outputs, when a photographed image 300 of the ingot 200 is input, a determination result indicating whether or not a crack 223 is formed in the ingot 200.

Incidentally, while the control unit 100 stores the learned model 400 according to the first embodiment in the example illustrated in FIG. 26, the learned model 400-2 according to the second embodiment may be stored in the present invention.

In the peeling apparatus 1 and the inspecting unit 30 as the inspecting apparatus according to the modification, the determining section 101 of the control unit 100 determines the presence or absence of a crack 223 whose shape is not fixed, by using the learned model 400 configured by machine learning. Thus, the peeling apparatus 1 and the inspecting unit 30 as the inspecting apparatus according to the modification produce an effect of being able to detect the crack 223 that occurs in the ingot 200.

In addition, as in the first embodiment, the peeling apparatus 1 and the inspecting unit 30 as the inspecting apparatus according to the modification produce an effect of being able to photograph the crack 223 in the ingot 200 easily by using the principle of what is generally called the magic mirror in order to form a photographed image 300 on the basis of the principle of the magic mirror.

It is to be noted that, while an example in which the present invention is applied to a semiconductor ingot has been described in the above description, the inspecting apparatus and the peeling apparatus according to the present invention are not limited to semiconductor ingots, and are similarly applicable also to a peeled wafer manufactured by irradiating the polished surface of an ingot with a laser beam, thereby forming a peel-off layer including a modified layer and cracks extending from the modified layer along the c-plane, and peeling off the wafer from the ingot with the peel-off layer as a starting point.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An inspecting apparatus for inspecting a semiconductor ingot having one surface and another surface, the one surface being a polished surface resulting from polishing, the inspecting apparatus comprising:

a holding table configured to hold the semiconductor ingot with the polished surface of the semiconductor ingot exposed;

a light source configured to irradiate the polished surface of the semiconductor ingot held by the holding table with light at a predetermined incidence angle;

an imaging unit configured to condense and photograph reflected light reflected by the polished surface of the semiconductor ingot, and form a photographed image emphasizing unevenness produced on the polished surface by a crack extending in the semiconductor ingot; and a determining section configured to determine a state of the semiconductor ingot by comparing the formed photographed image with a preset condition;

the determining section including a processor and a memory, and including a learned model configured by machine learning to output, when the photographed image obtained by the imaging unit is input, a determination result indicating whether or not the crack is formed in the semiconductor ingot;

wherein the learned model utilizes a cascade classifier comprising a plurality of strong discriminators each configured to include a plurality of weak discriminators, each of the plurality of weak discriminators being configured to determine whether a feature quantity is present in the photographed image and assign an output value to the feature quantity; and wherein, the feature quantity is determined by identifying an amount of light received by a particular pixel among a plurality of pixels composing the photographed image and comparing the amount of light received with a threshold value, a result of the comparison indicating a presence of the crack in the semiconductor ingot.

2. The inspecting apparatus according to claim 1, wherein the cascade classifier is made to learn an image of the crack on a basis of sample images including a photographed image including the crack and a photographed image without the crack.

3. The inspecting apparatus according to claim 1, wherein the learned model is a neural network including an input layer to which the photographed image is input and an output layer that outputs the determination result.

4. The inspecting apparatus according to claim 1, wherein the learned model further includes a determiner configured to calculate a total value based on the output value provided by each of the plurality of weak discriminators and a coefficient generated by the learned model, and to analyze the total value to determine whether the total value exceeds a second threshold.

5. A peeling apparatus for manufacturing, with a peel-off layer as a starting point, a wafer from a semiconductor ingot in which the peel-off layer including a modified layer and a crack extending from the modified layer along a c-plane is formed by irradiating an exposed polished surface of the semiconductor ingot with a laser beam, the peeling apparatus comprising:

a holding table configured to hold the semiconductor ingot;

a peeling unit configured to peel off the wafer from the semiconductor ingot held on the holding table;

a temporary placement table on which the wafer peeled off by the peeling unit is temporarily placed; and an inspecting unit configured to inspect the wafer held on the temporary placement table;

the inspecting unit including a light source configured to irradiate the polished surface of the semiconductor ingot held by the holding table with light at a predetermined incidence angle, an imaging unit configured to condense and photograph reflected light reflected by the polished surface of the semiconductor ingot, and form a photographed image emphasizing unevenness produced on the polished surface by a crack extending in the semiconductor ingot, and a determining section configured to determine a state of the semiconductor ingot by comparing the formed photographed image with a preset condition, the determining section including a processor and a memory, and including a learned model configured by machine learning to output, when the photographed image obtained by the imaging unit is input, a determination result indicating whether or not the crack is formed in the semiconductor ingot, wherein the learned model utilizes a cascade classifier comprising a plurality of strong discriminators each configured to include a plurality of weak discriminators, each of the plurality of weak discriminators being configured to determine whether a feature quantity is present in the photographed image and assign an output value to the feature quantity, and wherein, the feature quantity is determined by identifying an amount of light received by a particular pixel among a plurality of pixels composing the photographed image and comparing the amount of light received with a threshold value, a result of the comparison indicating a presence of the crack in the semiconductor ingot.

6. A learned model generating method for generating a learned model configured to determine a state of a semiconductor ingot having one surface and another surface, the one surface being a polished surface resulting from polishing, the learned model generating method being performed by an inspecting apparatus including a holding table configured to hold the semiconductor ingot with the polished surface of the semiconductor ingot exposed;

a light source configured to irradiate the polished surface of the semiconductor ingot held by the holding table with light at a predetermined incidence angle;

an imaging unit configured to condense and photograph reflected light reflected by the polished surface of the semiconductor ingot, and form a photographed image emphasizing unevenness produced on the polished surface by a crack extending in the semiconductor ingot; and a determining section configured to determine a state of the semiconductor ingot by comparing the formed photographed image with a preset condition, the determining section having a processor and a memory, the learned model generating method comprising:

an image obtaining step of obtaining a plurality of first learning images corresponding to an image of a sample including a crack and a plurality of second learning images corresponding to an image of the sample including no crack, by photographing the semiconductor ingot as the sample by irradiating the polished surface with light from a light source at a predetermined incidence angle and condensing and photographing the light reflected by the polished surface; and a learning step of generating, by machine learning using the first learning images and the second learning images, the learned model configured to output, when an image of the semiconductor ingot is input, the determination result indicating whether or not the crack is formed in the semiconductor ingot, wherein the learned model utilizes a cascade classifier comprising a plurality of strong discriminators each configured to include a plurality of weak discriminators, each of the plurality of weak discriminators configured to determine whether a feature quantity is present in the photograph of the semiconductor ingot and to assign an output value to the feature quantity, and wherein, the feature quantity is determined by identifying an amount of light received by a particular pixel among a plurality of pixels composing the photographed image and comparing the amount of light received with a threshold value, a result of the comparison indicating a presence of the crack in the semiconductor ingot.

7. The learned model generating method according to claim 6, wherein the cascade classifier is made to learn an image of the crack on a basis of the first learning images and the second learning images.

8. The learned model generating method according to claim 7, wherein the learned model is a neural network including an input layer to which the first learning images and the second learning images are input and an output layer that outputs the determination result.

* * * * *